US008484837B2

(12) United States Patent
Nickut et al.

(10) Patent No.: US 8,484,837 B2
(45) Date of Patent: Jul. 16, 2013

(54) METHOD FOR CONDUCTIVELY CONNECTING A COMPONENT ON A TRANSPARENT SUBSTRATE

(75) Inventors: Andreas Nickut, Delligsen (DE); Bernd Albrecht, Delligsen (DE); Peter Kracht, Holzminden (DE)

(73) Assignee: Schott AG, Mainz (DE)

( * ) Notice: Subject to any disclaimer, the term of this patent is extended or adjusted under 35 U.S.C. 154(b) by 98 days.

(21) Appl. No.: 13/273,154

(22) Filed: Oct. 13, 2011

(65) Prior Publication Data
US 2012/0266461 A1 Oct. 25, 2012

Related U.S. Application Data

(63) Continuation of application No. PCT/EP2010/001961, filed on Mar. 27, 2010.

(30) Foreign Application Priority Data

Apr. 16, 2009 (DE) .......................... 10 2009 017 659

(51) Int. Cl.
*H05K 3/34* (2006.01)
*H01R 9/00* (2006.01)
*H05K 3/00* (2006.01)

(52) U.S. Cl.
USPC ................................ 29/840; 29/843; 29/839

(58) Field of Classification Search
USPC ............. 29/831, 832, 839, 840, 843; 385/88, 385/89, 92; 219/121.64, 121.6, 121.63, 121.66; 228/180.22, 234.1, 102
See application file for complete search history.

(56) References Cited

U.S. PATENT DOCUMENTS

| 5,305,944 | A | * | 4/1994 | Yoshida et al. | 228/180.22 |
|---|---|---|---|---|---|
| 5,338,435 | A | * | 8/1994 | Betts et al. | 204/406 |
| 6,275,157 | B1 | * | 8/2001 | Mays et al. | 340/572.5 |
| 6,284,998 | B1 | * | 9/2001 | Sinkunas et al. | 219/121.64 |
| 6,394,158 | B1 | * | 5/2002 | Momeni | 156/272.8 |
| 6,599,031 | B2 | * | 7/2003 | Li | 385/88 |
| 6,919,529 | B2 | * | 7/2005 | Franzen et al. | 219/121.64 |
| 7,187,066 | B2 | * | 3/2007 | Frutschy | 257/678 |
| 7,464,850 | B2 | * | 12/2008 | Kim | 228/4.1 |
| 7,504,604 | B2 | * | 3/2009 | Rossopoulos et al. | 219/121.66 |
| 7,538,295 | B2 | * | 5/2009 | Amesbury et al. | 219/121.63 |
| 7,816,179 | B2 | * | 10/2010 | Kim | 438/108 |
| 8,016,973 | B2 | * | 9/2011 | Shinjo et al. | 156/272.8 |
| 8,017,886 | B2 | * | 9/2011 | Amesbury et al. | 219/121.63 |

FOREIGN PATENT DOCUMENTS

| DE | 2343235 | 3/1975 |
|---|---|---|
| DE | 4312642 A1 | 10/1993 |

OTHER PUBLICATIONS

International Search Report for PCT/EP2010/001961, dated Jul. 27, 2010. (6 pages).

*Primary Examiner* — David Angwin
(74) *Attorney, Agent, or Firm* — Taylor IP, P.C.

(57) ABSTRACT

The invention relates to a method to conductively connect an electrical component with at least one conductive layer, whereby the conductive layer is applied to a substrate which is essentially transparent in the visible wavelength zone of light, comprising the following steps: the electrical component or the conductive layer is provided with a soldering material in the area where the component is to be connected to the conductive layer; the soldering material is provided with energy supplied by an energy source, such that the soldering material melts and a non-detachable, material-bonded conductive connection between the electrical component and the conductive layer is established.

33 Claims, 1 Drawing Sheet

OTHER PUBLICATIONS

Notification of Transmittal of Translation of the International Preliminary Report on Patentability for PCT/EP2010/001961 dated Oct. 18, 2011 (10 pages).

Search and Examination Report dated Dec. 19, 2012 for Singapore Patent Application No. 201107414-3 (10 pages).

English translation of International Preliminary Report on Patentability dated Oct. 18, 2011 for PCT/EP2010/001961 (10 pages).

English translation of Written Opinion of the International Searching Authority (undated) for PCT/EP2010/001961 (9 pages).

* cited by examiner

METHOD FOR CONDUCTIVELY CONNECTING A COMPONENT ON A TRANSPARENT SUBSTRATE

CROSS-REFERENCE TO RELATED APPLICATIONS

This is a continuation of PCT application No. PCT/EP2010/001961, entitled "METHOD FOR CONDUCTIVELY CONNECTING A COMPONENT ON A TRANSPARENT SUBSTRATE", filed Mar. 27, 2010, which is incorporated herein by reference.

BACKGROUND OF THE INVENTION

1. Field of the Invention

The invention relates to a method for conductively connecting an electrical component having at least one conductive layer, whereby the conductive layer is applied to a substrate which is essentially transparent in the visible wavelength zone of light. In the current application "visible wavelength" is to be understood to represent that the transmission between 420 nm and 700 nm of the layer or respectively the substrate is greater than 60%, especially greater than 80%, preferably greater than 90%.

2. Description of the Related Art

It is known from the current state of the art, in particular from WO 01/82378 to install components, in particular light emitting diodes on a transparent substrate having a conductive layer with the assistance of a soldering method. According to WO 01/82378 this is possible in that connection points composed of a conductive paste or lacquer were applied to a substrate having a conductive layer and that these connection points were then connected in a soldering process with the components, in particular with the light emitting diodes.

A definitive method is not described in WO 01/82378; however, the process step of soldering of components onto glass was generally carried out manually with a manual soldering iron and soldering wire.

DE 10 2004 018 109 A1 provides that for a plate element having at least one plate which is equipped with an electrically conductive structure, in particular an electrically heatable coating, an electric contact is established for this layer, for example through a solder connection, whereby the soldering effect is also brought to the soldering location through the rigid plate.

However, DE 10 2004 018 109 A1 does not describe installation of the components on the electrically conductive layer but instead describes only the installation of the electric connection to a conductive structure which is used for heating purposes.

From EP 0 584 356 it has become known to combine a method for soldering a component which is to be connected with a base material by means of radiation of the component with laser light. This method essentially relates to the connection of a metal material with an IC-chip or a capacitor.

It is not disclosed in EP 0 584 356 that the base material may comprise a transparent substrate. Moreover, soldering occurs from the top onto the base material.

Soldering by means of infrared light has become known from DE 43 12 642, whereby a conductive element such as a conductive wire or contact patch can be connected with a semiconductor chip.

Reflow-soldering of lamps on a transparent substrate has become known from DE 100 19888 A1.

DE-A-23 43 235 presents soldering of printed circuits with the assistance of visible light and/or infrared light on a strip conductor. The carrier body with a strip conductor according to DE 23 43 235 is substantially diathermanous to heat radiation. The material of the strip conductor is not cited. According to DE23 43 235 an ultrasound source is to be provided additionally in order to achieve rapid heating of the contact surfaces to be soldered and flowing of the soldering material.

DE 195 04 967 A1 presents a method for thermal connection of contact elements of a flexible substrate with contact metallizing of an electronic component whereby the energy supply occurs through laser irradiation.

It is the objective of the current invention, and what is needed in the art is, to overcome the disadvantages of the current state of the art, and in particular to cite a rational method with which electrical elements with an electrically conductive coating can be connected simply on a transparent substrate.

SUMMARY OF THE INVENTION

According to the invention this is achieved with, and the present invention provides, a method to conductively connect an electrical component with at least one conductive layer, whereby the conductive layer is applied to a substrate which is essentially transparent in the visible wavelength zone of light, comprising the following steps:

the electrical component or the conductive layer is provided with a soldering material in the area where the component is to be connected to the conductive layer, preferably an energy source which emits electromagnetic radiation, especially a light source, preferably a halogen lamp or a laser light source;

the soldering material is provided with energy supplied by an energy source, such that the soldering material melts and a non-detachable, material-bonded conductive connection between the electrical component and the conductive layer is established.

The present invention provides a method for conductively connecting an electric component with at least one strip conductor or one conductive layer, whereby the strip conductor or the conductive layer is applied to a substrate which is transparent in the visible wavelength range of the light, whereby the transparent substrate comprises a heat-absorbing layer and whereby the conductive layer is at the same time the heat-absorbing layer, comprising the following steps: the electrical component or the strip conductor or the conductive layer is provided with a soldering material in the region where the component is to be connected with the conductive layer or the strip connector; the soldering material is supplied with automated energy which is provided from an energy source which emits electromagnetic radiation in such a way that the provided energy is essentially brought into the heat-absorbing strip connector or conductive layer at the location where the component is to be attached, so that the soldering material melts and a non-detachable, material-bonded, conductive connection between the electrical component and the strip connector or the conductive layer is formed at minimal stress to the component at short soldering time.

Through the inventive method rapid soldering—which may also be automated—of components, especially of light conducting diodes on a transparent substrate becomes possible. Through rapid soldering, in particular automated soldering a shortening of the frequency rate by a factor of 2.5 compared to the current state of the art, as well as operator independent operation is achieved. Moreover, secure electrically conductive connections between the component and the conductive structures arranged on the transparent substrate are created. An additional advantage is that utilization of solvent-containing cleaning agents is avoided, so that already existing glass-brush wash-machines can be used. Moreover, the possibility of soldering flexible connections occurs.

Connection of the components may be implemented for example directly on a strip conductor, for example on a strip conductor which comprises tin oxide or silver.

Compared to the hitherto conventional gluing of components on a transparent substrate, especially of glass, soldering has a multitude of advantages. Soldering material has a higher UV-resistance than adhesives. This is particularly advantageous in outdoor applications. In addition, soldering material is practically 100% conductive, whereas the conductivity of adhesives is lower.

In a first design form of the invention the soldering material is applied to an electrically conductive coating which is transparent in the visible zone. The conductive coating may for example include tin oxide.

An alternative embodiment of the invention may provide that initially connecting points are applied to the conductive layer, for example by means of screen printing or screen process printing or by means of transfer decals. The soldering material is then applied to the connecting points. The soldered connection is then formed between the connecting points and the component. The connecting points may for example consist preferably of a conductive paste or lacquer, for example silver-conductive lacquer or silver-conductive paste. Preferably after application, for example through screen printing, the conductive paste or lacquer is preferably baked on. Baking can at the same time provide pre-tensioning of the transparent substrate, especially the transparent glass substrate. A greater mechanical strength for subsequent process steps is hereby achieved.

The transparent substrate preferably has a top surface and a bottom surface, whereby the transparent conductive layer is applied onto the top surface and whereby the energy from the energy source, preferably the light source, is radiated from the bottom surface through the transparent substrate, into the material which is to be connected. Radiation of the energy from the bottom side through the substrate has the effect that the temperature load of the component which is to be conductively connected with the transparent coating is reduced to a minimum.

It is especially advantageous if the transparent substrate includes a heat-absorbing layer, for example a metal oxide layer, for example a fluorine doped tin oxide layer. The soldering time can be drastically reduced by the heat-absorbing layer, since the fact that the transparent layer is heated at the point at which the component is to be attached is taken advantage of. Because the heat is supplied essentially into the conductive transparent substrate the component has minimal stress exposure during short soldering time. Short soldering times are for example soldering times shorter than 60 seconds, especially shorter than 30 seconds, preferably shorter than 10 seconds, especially preferably shorter than 5 seconds, in particular shorter than 1 second. In particular due to the fact that the conductive coating is in the embodiment of a heat-absorbing layer, additional utilization of an ultrasound device as described in DE 23 43 235 in order to achieve short soldering times can be forgone.

It is especially preferred if the conductive layer which may in particular also be heat-absorbent includes a metal oxide, preferably ITO (InOx:Sn), FTO (SnOx:F) or ATO (SnOx:Sb). However, ZnOx:Ga, ZnO:F, ZnOx:B, ZnOx:Al or Ag/TiOx are also conceivable. In the aforementioned compounds x is in the range of between 1 and 2, depending upon the doping concentration and the stoichiometry. Particularly preferred is SnO2:F or respectively SnO2:Sb. If the transparent substrate, in particular the glass substrate is furnished with an FTO-layer (SnOx:F) soldering times of less than 30 seconds, in particular less than 10 seconds, preferably in the range of 10 seconds to 0.1 seconds, in particular in the range of 10 seconds to 1 second can be achieved when using halogen lamps, for example having wave lengths in the range of 500-1500 nm and a power consumption in the range of 50 W to 1000 W, in particular 100 W to 500 W. When using layers of this type it is possible, even with relatively low power consumption to achieve very short soldering times without additional means, such as for example irradiation of ultra sound energy, according to DE 23 43 235. Due to the relatively low power consumption and at the same time short soldering times, especially gently processing is made possible.

Application methods considered for the conductive layer onto the transparent substrate are chemical vapor deposition (CVD), physical vapor deposition (PVD), dip coating or chemical or electro-chemical coating. Also possible is spray pyrolysis, sputtering or a sol-gel process. Application by means of spray pyrolysis is especially cost effective, whereby the preferred coating material is fluorine doped tin oxide (SnOx:F). If particularly high optical properties are to be achieved, then the preferred application method is sputtering.

The transparent substrate can be glass or a synthetic substrate. Suitable substrate materials are in particular those which are transparent or quasi-transparent. Transparent substrates are to be understood to be those which possess a transmission >80% in the visible wavelength range. Quasi-transparent layers or respectively glasses are to be understood in the current application to be those with a transmission >60% in the visible wavelength range. The visible wavelength range is preferably between 420 nm and 700 nm. Glasses to be considered are in particular soda-lime glasses which are coated with fluorine doped tin oxide (SnOx:F).

The automated energy supply occurs for example with the assistance of electromagnetic waves, in particular for example with the assistance of light. The utilization of light is however also described as light soldering process. In the light soldering process a light beam with light in the visible or in the IR-wavelength range is for example guided from below through the horizontally positioned substrate, whereby the beam also meets the transparent layer which is supplied with the soldering paste and the component which is to be soldered. In light soldering, shortwave infrared light with a wavelength of 0.5 to 2 µm is targeted particularly focused onto the soldering location. The focus occurs preferably in that the light source is arranged in a focal point of a hemi-ellipsoidal minor, so that all rays emitted from the light source are focused in the second focal point of the ellipse. On the surface of the soldering location the energy is converted into heat through absorption. The radiation energy can be varied through the output of the light source, the radiation duration, and the type of focusing, meaning that the energy supply can be set and also adjusted very precisely through the parameters of time, lamp current and focus location. The diameter of the focus point is in the range of a few millimeters, preferably between 0.1 mm and 100 mm depending upon the optical system. The light of a halogen lamp may for example be used as light source. The wavelength of the light is between 500 nm and 1500 nm, the power consumption of the halogen lamp at 50 W to 1000 W, preferably 100 W to 500 W, in particular at 250 W.

A special light source besides the halogen light source for light soldering would be a light source which emits for example IR-radiation with a wavelength of >700 nm.

Especially preferred is a method for conductively connecting an electric component with at least one strip conductor or one conductive layer, whereby the strip conductor or the conductive layer is applied to a substrate which is transparent in the visible wavelength range of the light, whereby the transparent substrate comprises a heat-absorbing layer and whereby the conductive layer is at the same time the heat-absorbing layer, comprising the following steps:

the electrical component or the strip conductor or the conductive layer is provided with a soldering material in the region where the component is to be connected with the conductive layer or the strip connector;

the soldering material is supplied with automated energy which is provided from an energy source which emits electromagnetic radiation in such a way that the provided energy is essentially brought into the heat-absorbing strip connector or conductive layer at the location where the component is to be attached, so that the soldering material melts and a non-detachable, material-bonded, conductive connection between the electrical component and the strip connector or the conductive layer is formed at minimal stress to the component at short soldering time.

In particular without restriction hereto the soldering time is less than 30 seconds, in particular less than 10 seconds, preferably in the range between 0.1 seconds and 10 seconds, preferably between 1 second and 10 seconds.

The wavelength of the emitted electromagnetic radiation of the energy source, in particular the light source, is in preferably the range of 500 nm to 1500 nm.

The energy source can for example be a halogen lamp with a power consumption of between 50 W and 1000 W, especially 100 W and 500 W.

The electromagnetic radiation is preferably targeted onto a focus point, whereby the focus point has a diameter in the range of 0.1 mm to 100 mm, preferably 1 mm to 10 mm.

In one embodiment of the method the transparent substrate has a top surface and a bottom surface, whereby the transparent conductive layer is applied onto the top surface and whereby the energy from energy source is radiated from the bottom surface through the transparent substrate to the soldering material.

The conductive layer preferably includes a metal oxide, selected from one or more of the following metal oxides:

$InO_x$:Sn
$SnO_x$:F
$SnO_x$:Sb
$ZnO_x$:Ga
$ZnO_x$:B
$ZnO_x$:F
$ZnO_x$:Al
Ag/$TiO_x$ whereby x is in the range between 1 and 2, depending on the doping concentration.

A conductive layer of this type can for example be applied with one of the following methods:

CVD
PVD
Spray pyrolysis
Sputtering
a sol-gel-method onto the transparent substrate.

The transparent substrate is preferably a glass or synthetic substrate, especially a hardened or pre-tensioned glass substrate.

The soldering material is preferably a solder on the basis of one of the following materials:

tin-lead
tin
lead
gold
indium
aluminum

In a first embodiment the soldering material can be applied to the conductive layer of the transparent substrate such that the soldering material creates a conductive connection on the transparent substrate between the component and the conductive layer.

Instead of soldering with the assistance of infrared light it would also be possible to implement induction soldering. In induction soldering the electromagnetic induction effect is used for heat generation. Due to skillful shaping, the inductor in induction soldering is able to apply targeted heat to only the soldering location. The changing electrical field carries an alternating magnetic field which in turn generates the heat necessary for soldering through an electrical rotational field in the components.

Additional soldering methods which may be utilized are laser soldering methods and ultrasound soldering methods.

Various materials may be considered as soldering materials for the soldering method. Possible materials may be based on tin-lead, tin, lead, gold, indium or aluminum. Especially preferred are soldering materials having approx. 90 weight-% of tin alloy and 10 weight-% of fluxing agent. Especially preferred are lead-free soldering materials.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

FIGS. 1a through 1d show a process sequence for the production of a component arrangement, comprising a transparent substrate with transparent conductive layer and components arranged thereupon, in particular light emitting diodes or respectively LED-modules.

Figure 1A:
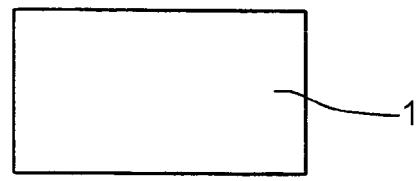
FIGS. 1a-1d show the typical process sequence to produce a component arrangement with the transparent conductive coating on a transparent substrate and components arranged thereupon, in particular light emitting diodes, using light in so-called light soldering.

When producing a component arrangement, a substrate 1 with a transparent conductive layer is coated over its entire surface in the illustrated design variation, for example in the sol-gel method (FIG. 1a). The layer is preferably not only a conductive transparent layer, for example an ITO-layer, but a conductive transparent layer which is also heat absorbent. Heat absorbent layers are tin oxide layers, for example FTO ($SnO_x$:F) or ATO ($SnO_x$Sb). Conceivable are however also $ZnO_x$:Ga, $ZnO_x$:B, $ZnO_x$:Al or Ag/$TiO_x$, whereby x is in the range between 1 and 2, depending on the doping concentration and stoichiometry.

Subsequently a structuring is produced according to FIG. 1b, for example by means of laser which locally heats the coating and vaporizes same.

The transparent substrates which are structured with the assistance of a laser include preferably a conductive layer which—in the range of the laser wavelength of the utilized laser—possesses high absorption and a transparent substrate which is transmissive at this wavelength. In a system of this type the glass layer exhibits only minor damage. Tear formation, in particular, can largely be avoided in systems of this type.

Figure 1B:
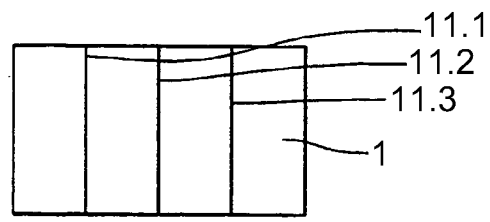
Figure 1D:
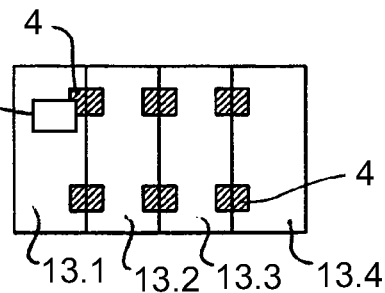
Figure 1C:
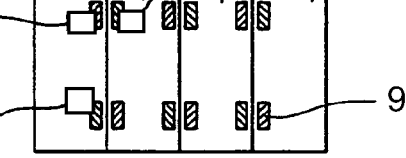

The separation lines in the individual zones of the substrate are identified with reference numbers 11.1-11.3 in FIG. 1b. Components 108 (only shown in zones 13.1, 13.2) are subsequently arranged on the structuring according to FIG. 1b in zones 13.1-13.4 (FIGS. 1c-1d). The components are surface-mountable components, so-called SMD-components, for example LED chips. In the current example the components are attached directly to the conductive transparent substrate through an automated soldering process, in particular through light-soldering with IR-radiation (FIG. 1c) or through connecting pads (FIG. 1d).

Instead of a substrate equipped with a conductive coating whereby the conductive coating is structured and serves to conduct current, a transparent substrate, for example a glass substrate can be equipped with metal strips, for example silver strips as conductive coating. The silver strips which are designed as strip conductors are so narrow (for example only a few μm wide) and designed that they are invisible to an observer from a distance.

The attachment of the components is described below.

Direct application of the components, as illustrated in FIG. 1c is described first.

The preferred method is single point soldering with light, which preferably is used always when components are to be attached with only a few soldering points. In light soldering the light of a halogen lamp (wavelength: 500-1500 nm, power consumption: 250 W) is bundled onto the soldering location by means of a convergence minor and optic. The necessary temperature at the soldering location is created by the absorption of the heat radiation.

It is especially preferred when the substrate is a heat absorbing and at the same time a conductive layer, especially a tin oxide layer, for example FTO (SnOx:F) or ATO (SnOx:Sb). Layers of this type can absorb an amount of heat radiation so that the soldering time is less than 30 seconds, in particular less than 10 seconds, in particular is in the range of 1 to 10 seconds. For a halogen lamp with 250 W power (wavelength: 500-1500 nm) and a glass substrate coated with SnOx:F the following soldering times result, depending on the thickness of the glass substrate which is generally irradiated from below:

| Thickness of substrate | soldering time |
| --- | --- |
| 4 mm | 6.5 s |
| 6 mm | 7.5 s |

The soldering material is applied to the glass substrate prior to the light soldering process, for example in the form of soldering paste at the locations at which the components are to be connected with the substrate, or respectively with the conductive layer which was applied to the substrate.

A soldering paste is a highly viscous mixture of soldering metal powder or fluxing agent and serves predominantly to solder surface-mountable components (SMD). Soldering pastes suitable for SMD-soldering consist for example of up to approx. 90% globules of a tin alloy and approx. 10% of a fluxing agent. Lead-free soldering pastes (RoHS) consist for example of 96.5% Sn, 3.0% Ag, 0.5% Cu. The soldering paste can be applied by means of a dispenser, either directly onto the conductive coating of the substrate (FIG. 1c) or onto connection pads (FIG. 1d).

The volume of energy in the form of light, in particular IR-light supplied for example by a halogen lamp to soldering pads 4 leads to melting of the soldering globules contained in the soldering paste which then provides the electrical and mechanical connection between the conductive coating and the component part, or respectively the component element through fusing together of the particles in the soldering paste and with the component contacts, or respectively the conductive layer of the glass substrate (FIG. 1c). In FIG. 1c the conductive coating is structured into four zones. An SMD-component 108 which is connected directly to the conductive coating through melting of soldering pad 4 is illustrated only in zone 13.1.

The fluxing agent in the soldering paste facilitates the melting process in that it reduces the surface tension, prevents oxidation and reduces possibly present oxide residues. It evaporates later and leaves a good electrical soldering connection between components and soldering pads.

The advantages of the previously described single soldering process can thus be summarized:
  contact-free and precise heat transfer;
  low operating costs at relatively small investment.

Light soldering referred to above may also be utilized if connection pads 9 (see FIG. 1d) have previously been applied to the glass substrate.

Connection pads 9 include a conductive paste or lacquer, for example silver conductive lacquer or silver paste which is applied to the conductive substrate by means of screen printing or screen process printing and is subsequently baked on. Baking can at the same time provide pre-tensioning of transparent substrate 1, especially the transparent glass substrate. A greater mechanical strength for subsequent process steps is hereby achieved.

In the method using connection pads the various zones 13.1-13.4 are equipped with SMD-components for example light emitting diodes, subsequent to the application of the connection pads. Prior to this equipping process, soldering paste is applied to the connection pads.

The glass substrate is then equipped with component elements. Then the soldering process occurs as previously described by means of light soldering. In light soldering, for example with a halogen lamp, light from the halogen lamp is focused onto the location at which the soldering process is to occur. The IR-radiation emitted from the light source heats the soldering material. The soldering material melts and on the one hand moistens the connection of the component, as well as the connection pad. Then, the energy supply is terminated and the soldering material solidifies, so that a material-bonded conductive connection is established between the electrical component and the conductive layer.

The soldering materials to be considered are the previously described materials. Alternative materials are soldering materials on the basis of:
  tin-lead
  tin
  lead
  gold
  indium
  aluminum.

After the components, especially the light emitting diodes are conductively connected through the inventive soldering method with the strip connectors which were applied to the transparent substrate, the transparent substrate with the components can be further processed, for example, it can be provided with an additional layer.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method for conductively connecting an electrical component with one of at least one strip conductor and one conductive layer, said method comprising the steps of:
   applying one of the strip conductor and the conductive layer to a transparent substrate which is transparent in a visible wavelength range of light, said transparent substrate including a heat-absorbing layer, the conductive layer being at the same time said heat-absorbing layer;
   providing one of the electrical component, the strip conductor, and the conductive layer with a soldering material in a region where the electrical component is to be connected with one of the conductive layer and the strip connector;
   supplying said soldering material with an energy which is automated and which is provided from an energy source which emits an electromagnetic radiation in such a way that said energy which is provided is essentially brought into one of a heat-absorbing said strip connector and a heat-absorbing said conductive layer at a location where the electrical component is to be attached so that said soldering material melts and a non-detachable, material-bonded, conductive connection between the electrical component and one of the strip connector and the conductive layer is formed at a minimal stress to the electrical component at a short soldering time.

2. The method according to claim 1, wherein said soldering time is one of (a) less than 30 seconds, (b) less than 10 seconds, (c) in a range of between 0.1 seconds and 10 seconds, and (d) in a range of between 1 second and 10 seconds.

3. The method according to claim 1, wherein a wavelength of an emitted said electromagnetic radiation of said energy source is in a range of 500 nm to 1500 nm, said energy source being a light source.

4. The method according to claim 1, wherein said energy source is a halogen lamp with a power consumption of one of (a) between 50 W and 1000 W, and (b) between 100 W and 500 W.

5. The method according to claim 1, wherein said energy source is a laser light source.

6. The method according to claim 1, wherein said electromagnetic radiation is targeted onto a focus point which has a diameter in a range of one of (a) 0.1 mm to 100 mm, and (b) 1 mm to 10 mm.

7. The method according to claim 1, wherein said transparent substrate has a top surface and a bottom surface, the conductive layer being transparent and being applied onto said top surface, said energy from said energy source being radiated from said bottom surface through said transparent substrate to said soldering material.

8. The method according to claim 1, wherein the conductive layer includes a metal oxide selected from at least one of the following metal oxides: $InO_x$:Sn; $SnO_x$:F; $SnO_x$:Sb; $ZnO_x$:Ga; $ZnO_x$:B; $ZnO_x$:F; $ZnO_x$:Al; and $Ag/TiO_x$; wherein x is in a range of between 1 and 2 depending on a doping concentration.

9. The method according to claim 7, wherein the conductive layer is applied onto said transparent substrate with one of the following methods: CVD; PVD; Spray pyrolysis; Sputtering; and a sol-gel-method.

10. The method according to claim 1, wherein said transparent substrate is one of a glass and a synthetic substrate.

11. The method according to claim 10, wherein said transparent substrate is a glass substrate which is one of hardened and pre-tensioned.

12. The method according to claim 1, wherein a solder connection is established through one of the following methods: a light soldering method; and an inductive soldering method.

13. The method according to claim 1, wherein said soldering material is a solder based on one of the following materials: tin-lead; tin; lead; gold; indium; and aluminum.

14. The method according to claim 1, wherein said soldering material is applied to the conductive layer of said transparent substrate, said soldering material creating said conductive connection on said transparent substrate between the electrical component and the conductive layer.

15. The method according to claim 1, wherein a plurality of connecting points are applied onto the conductive layer and said solder material forms said conductive connection between the electrical component and a respective one of said plurality of connecting points.

16. A method for conductively connecting an electrical component with one of at least one strip conductor and one conductive layer, said method comprising the steps of:
   applying one of the strip conductor and the conductive layer to a transparent substrate which is transparent in a visible wavelength range of light;
   providing one of the electrical component, the strip conductor, and the conductive layer with a soldering material in a region where the electrical component is to be connected with one of the conductive layer and the strip connector;
   supplying said soldering material with an energy which is automated and which is provided from an energy source so that said soldering material melts and a non-detachable, material-bonded, conductive connection between the electrical component and one of the strip connector and the conductive layer is formed.

17. The method according to claim 16, wherein said soldering material forms said conductive connection directly between the electrical component and said transparent substrate.

18. The method according to claim 16, wherein a plurality of connecting points are applied to one of the conductive layer and the strip conductor and said soldering material creates said conductive connection between the electrical component and a respective one of said plurality of connecting points.

19. The method according to claim 16, wherein said transparent substrate has a top surface and a bottom surface, the conductive layer being transparent and being applied onto said top surface, said energy from said energy source being radiated from said bottom surface through said transparent substrate to said soldering material.

20. The method according to claim 16, wherein said transparent substrate includes a heat-absorbing layer.

21. The method according to claim 20, wherein the conductive layer is at the same time said heat-absorbing layer.

22. The method according to claim 16, wherein the conductive layer includes a metal oxide selected from at least one of the following metal oxides: $InO_x$:Sn; $SnO_x$:F; $SnO_x$:Sb; $ZnO_x$:Ga; $ZnO_x$:B; $ZnO_x$:F; $ZnO_x$:Al; and $Ag/TiO_x$; wherein x is in a range of between 1 and 2 depending on a doping concentration.

23. The method according to claim 22, wherein the conductive layer is applied onto said transparent substrate with one of the following methods: CVD; PVD; Spray pyrolysis; Sputtering; and a sol-gel-method.

24. The method according to claim 16, wherein said transparent substrate is one of a glass and a synthetic substrate.

25. The method according to claim 24, wherein said transparent substrate is a glass substrate which is one of hardened and pre-tensioned.

26. The method according to claim 16, wherein a solder connection is established through one of the following methods: a light soldering method; and an inductive soldering method.

27. The method according to claim 16, wherein said energy source emits an electromagnetic radiation.

28. The method according to claim 27, wherein said energy source is a light source, said light source being a halogen lamp.

29. The method according to claim 16, wherein said soldering material is a solder based on one of the following materials: tin-lead; tin; lead; gold; indium; and aluminum.

30. The method according to claim 16, wherein said energy is supplied to said soldering material for a short duration which is one of (a) shorter than 30 seconds, (b) shorter than 10 seconds, and (c) in a range of between 1 second and 10 seconds.

31. The method according to claim 30, wherein said energy which is supplied is a light energy, a wavelength of said light energy being in a range of 500 nm to 1500 nm.

32. The method according to claim 31, wherein said light energy which is supplied is provided by a halogen lamp, said halogen lamp having a power consumption of between 100 W and 500 W.

33. The method according to claim 31, wherein said light energy is targeted onto a focus point, said focus point having a diameter in a range of one of (a) 0.1 mm to 100 mm, and (b) 1 mm to 10 mm.

* * * * *

UNITED STATES PATENT AND TRADEMARK OFFICE
CERTIFICATE OF CORRECTION

PATENT NO. : 8,484,837 B2  
APPLICATION NO. : 13/273154  
DATED : July 16, 2013  
INVENTOR(S) : Nickut et al.

Page 1 of 1

It is certified that error appears in the above-identified patent and that said Letters Patent is hereby corrected as shown below:

On the Title Page

Under Item (56) References Cited, under FOREIGN PATENT DOCUMENTS please insert the following foreign documents:

```
--DE   4446289         6/1996
  DE   19504967        8/1996
  DE   10019888        10/2001
  DE   10249005        5/2004
  DE   102004018109    6/2005
  EP   0584356         3/1994
  WO   0182378         11/2001--.
```

Signed and Sealed this  
Thirtieth Day of December, 2014

Michelle K. Lee  
*Deputy Director of the United States Patent and Trademark Office*